(12) United States Patent
Nansai et al.

(10) Patent No.: US 6,313,654 B1
(45) Date of Patent: Nov. 6, 2001

(54) DEVICE TESTING APPARATUS AND TEST METHOD

(75) Inventors: Yuichi Nansai; Takao Murayama; Katsumi Kojima, all of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/339,062

(22) Filed: Jun. 23, 1999

(30) Foreign Application Priority Data

Jun. 24, 1998 (JP) .................................................. 10-177162

(51) Int. Cl.[7] ........................... G01R 31/26; F27D 11/00
(52) U.S. Cl. ........................... 324/760; 324/765; 219/412
(58) Field of Search .................................... 324/760, 765, 324/158.1; 219/412

(56) References Cited

U.S. PATENT DOCUMENTS 5,473,259 * 12/1995 Takeda ................................. 324/760
6,078,188 * 6/2000 Bannai et al. ....................... 324/765

* cited by examiner

*Primary Examiner*—Safet Metjahic
*Assistant Examiner*—Anjan K Deb
(74) *Attorney, Agent, or Firm*—Birch, Stewart, Kolasch & Birch, LLP

(57) ABSTRACT

An IC chip testing apparatus comprising a chamber 6 having inside it a test stage 8 for testing an IC chip 22, cooling units 60, 62 able to cool the inside of the chamber 6 to a temperature less than ordinary temperature, heating units 60, 62 able to heat the inside of the chamber 6 to return it to ordinary temperature, temperature sensors 72, 74 for detecting the temperature inside the chamber 6, and a temperature controller 70 for controlling the outputs of the cooling units and/or heating units 60, 62 in accordance with the outputs from the temperature sensors. The apparatus not only makes the temperature control stop but also automatically performs ordinary temperature reset processing when an alarm signal of a temperature abnormality inside the chamber is detected. Further, the apparatus automatically performs ordinary temperature reset processing when the time of continuous operation of the device testing apparatus is more than a predetermined time. In accordance with the apparatus, condensation can be effectively prevented from occurring inside the chamber even when a temperature alarm is emitted or the testing apparatus is operated continuously for a long period of time.

14 Claims, 4 Drawing Sheets

DEVICE TESTING APPARATUS AND TEST METHOD

BACKGROUND OF THE INVENTION

1. Field of the Invention

The present invention relates to a device testing apparatus and test method for testing IC chips and other electronic devices inside a chamber in a state of ordinary temperature or less (ordinary temperature or temperature lower than that), more particularly relates to a device testing apparatus and teat method able to effectively prevent the occurrence of condensation inside a chamber.

2. Description of the Related Art

In the process of production of a semiconductor device etc., a testing apparatus is necessary for testing the finally produced IC chip or other device. As one type of such a testing apparatus, there is known an apparatus for testing an IC chip at ordinary temperature or temperature conditions lower than ordinary temperature. This is because it is guaranteed as one of the features of an IC chip that it operates well at ordinary temperature or low temperature.

In such a testing apparatus, the top of the test head is covered by the chamber, the inside is made an air-tight space, IC chips are conveyed on the test head, the IC chips are pushed against the test head for connection, and the IC chips are tested while making the inside of the chamber an ordinary temperature within a certain temperature range or a low temperature state. This type of test is used to test the IC chips well and sort them into at least good chips and defective chips.

In this type of testing apparatus of the related art, in particular in low temperature tests, an abnormality sometimes occurs whereby it is no longer possible to maintain the temperature inside the chamber at a low temperature within a predetermined temperature range. When such a temperature abnormality occurs, the testing apparatuses of the related art were designed to output a temperature alarm signal.

When such a temperature alarm signal was emitted, the testing apparatuses of the related art were designed to stop all temperature control and notify the operator of the testing apparatus of the w abnormality. The operator then investigated the abnormality of the testing apparatus and requested suitable measures be taken.

When the operator fails to take suitable measures, when there is no operator nearby, etc., however, the testing apparatus remains in a state with the temperature control stopped and condensation is liable to occur inside the chamber. If condensation occurs inside the chamber, the moisture of the condensation deposits on the terminals of the test head side and terminals of the IC chips etc. and is liable to cause the phenomenon of short-circuiting and liable to have a detrimental effect on the testing apparatus and IC chips. Therefore, it is necessary to effectively prevent the occurrence of condensation inside the chamber.

Further, it is necessary to maintain the inside of the chamber at a predetermined temperature range not only in low temperature tests (for example, −55.0° C. to 15.9° C.), but also in ordinary temperature tests (for example, 16.0° C. to 39.9° C.). The inside of the chamber sometimes become a lower temperature in state than the outside of the chamber. In such a case, a temperature alarm is emitted and the temperature control of the testing apparatus is stopped. If this is allowed to continue unchecked, condensation is liable to occur inside the chamber in the same way as at the time of a low temperature test.

Further, when continuously operating the testing apparatus over a long period of time for a low temperature test, the introduction of outside air along with the insertion and removal of IC chips to and from the inside of the chamber etc. is liable to cause condensation inside the chamber due to the accumulation of moisture inside the chamber even if there is no temperature alarm.

SUMMARY OF THE INVENTION

The present invention was made in consideration of this situation and has as its object the provision of a device testing apparatus and test method able to effectively prevent the occurrence of condensation inside a chamber even when a temperature alarm is issued or the testing apparatus is operated continuously for a long period of time.

To achieve the object of the present invention, according to the present invention, there is provided a first device testing apparatus comprising a chamber having inside it a test stage for testing a device, a cooling unit able to cool the inside of the chamber to a temperature less than ordinary temperature, a heating unit able to heat the inside of the chamber to return it to ordinary temperature, a temperature sensor for detecting the temperature inside the chamber, and a temperature controller for controlling the output of the cooling unit and/or heating unit in accordance with an output from the temperature sensor, wherein the temperature controller comprises a reset alarm detecting means for detecting if a reset alarm signal relating to an abnormality inside the chamber has been emitted or not and an ordinary temperature resetting means for stopping the cooling by the cooling unit and starting up the heating unit to heat the inside of the chamber to return it to ordinary temperature based on the reset alarm signal detected by the reset alarm detecting means.

Further, to achieve the above object, according to the present invention, there is provided a first test method comprising the steps of maintaining the inside of a chamber at a predetermined low temperature and in that state testing a device transferred to the inside of the chamber, detecting if a reset alarm signal relating to an abnormality inside the chamber has been emitted or not, and stopping the cooling of the inside of the chamber by a cooling unit and starting up a heating unit to heat the inside of the chamber to return it to ordinary temperature based on the reset alarm signal detected at the step of detecting the reset alarm.

Further, to achieve the above object, according to the present invention, there is provided a second device testing apparatus comprising a chamber having inside it a test stage for testing a device, a cooling unit able to cool the inside of the chamber to a temperature less than ordinary temperature, a heating unit able to heat the inside of the chamber to return it to ordinary temperature, a temperature sensor for detecting the temperature inside the chamber, and a temperature controller for controlling the output of the cooling unit and/or heating unit in accordance with an output from the temperature sensor, wherein the temperature controller comprises a reset processing signal detecting means for detecting if an ordinary temperature reset processing signal has been emitted or not and an ordinary temperature resetting means for stopping the cooling by the cooling unit and starting up the heating unit to heat the inside of the chamber to return it to ordinary temperature based on the reset processing signal detected by the reset processing signal detecting means.

Further, to achieve the above object, according to the present invention, there is provided a second test method comprising the steps of maintaining the inside of a chamber at a predetermined low temperature and in that state testing a device transferred to the inside of the chamber, detecting if an ordinary temperature reset processing signal has been emitted or not, and stopping the cooling of the inside of the chamber by a cooling unit and starting up a heating unit to heat the inside of the chamber to return it to ordinary temperature based on the reset processing signal.

In the first and second testing apparatuses, the ordinary temperature resetting means preferably comprises a reset interruption alarm detecting means for judging if a reset interruption alarm signal has been emitted or not during ordinary temperature resetting processing and a reset interrupting means for interrupting the ordinary temperature resetting processing by the ordinary temperature resetting means when the reset interruption alarm signal has been detected by the reset interruption alarm detecting means.

Further, the first and second testing apparatuses preferably comprise a reset processing mode releasing means for releasing the ordinary temperature reset processing mode after the ordinary temperature reset processing by the ordinary temperature resetting means based on the reset alarm signal has ended or after the ordinary temperature reset processing has been interrupted by the reset interrupting means.

Further, the first and second testing apparatuses are preferably comprised so that the normal temperature control is resumed after the ordinary temperature reset processing by the ordinary temperature resetting means based on the reset alarm signal has ended, it is judged whether the ordinary temperature reset processing by the ordinary temperature resetting means has suitably ended, and it has suitably ended.

In the first and second testing apparatuses, the temperature controller preferably further comprises a condition judging means for judging if the ordinary temperature reset processing conditions have been met and allowing the start of the ordinary temperature reset processing by the ordinary temperature resetting means only when the conditions are met.

In the first testing apparatus, the reset alarm signal is not particularly limited, but a temperature alarm signal for notifying that the temperature inside the chamber is more than a predetermined temperature (for example, a temperature setting+α), a temperature alarm signal for notifying that the temperature in the chamber is less than a predetermined temperature (for example, a temperature setting+α), an alarm signal for showing an abnormality of the temperature sensor for detecting the temperature in the chamber, an abnormality alarm signal for showing that the temperature drop after the start of cooling in the chamber is too slow, an alarm signal for showing an abnormality in the cooling unit and/or heating unit, etc. may be given as examples.

In the first and second testing apparatuses, the reset interruption alarm signal is not particularly limited, but a cover alarm signal for notifying that the cover of the chamber is open, a temperature alarm signal for showing that the inside of the chamber is heated to be more than a predetermined temperature, etc. may be given as examples.

In the second device testing apparatus, the reset processing detecting means preferably measures the time of continuous operation of the device testing apparatus, detects when the time of continuous operation measured is a predetermined time or more, and detects the reset processing signal emitted at that time.

Further, in the second device testing apparatus, the reset processing detecting means may measure the number of lots of the devices tested by the device testing apparatus, detect when the number of lots measured reaches a point of a predetermined number of lots, and detect the reset processing signal emitted at that time.

Further, in the second device testing apparatus, the reset processing detecting means may detect a reset processing signal emitted from a main test use unit.

Still further, in the second device testing apparatus, the reset processing detecting means may detect a reset processing signal emitted from a host computer.

In the first device testing apparatus and test method of the present invention, the reset alarm detecting means of the temperature controller detects a reset alarm signal relating to an abnormality in the chamber. Based on this signal, the ordinary temperature reset means of the controller controls the cooling unit and heating unit to stop the cooling by the cooling unit and start up the heating unit to heat the inside of the chamber to return it to ordinary temperature. That is, in the first device testing apparatus and method according to the present invention, when an alarm signal of a temperature abnormality etc. inside the chamber is detected, not only is the temperature control simply made to stop, but ordinary temperature reset processing is performed automatically. By performing ordinary temperature reset processing automatically, the inside of the chamber is no longer left at the temperature of the time of the low temperature test or ordinary temperature test (temperature lower than the outside of the chamber) and the occurrence of condensation inside the chamber can be effectively prevented.

Further, in the second device testing apparatus and test method of the present invention, ordinary temperature reset processing is performed automatically when a reset processing signal is detected showing that the time of continuous operation of the device testing apparatus is more than a predetermined time. When the testing apparatus has been operated continuously for a long period of time for a low temperature test, the introduction of outside air accompanying the insertion and removal of the IC chips to and from the inside of the chamber etc. sometimes leads to moisture accumulating inside the chamber. Therefore, even when the temperature control is not stopped by a temperature alarm etc., condensation is liable to occur inside the chamber. In the second device testing apparatus and test method of the present invention, it is possible to effectively remove the moisture inside the chamber and effectively prevent the occurrence of condensation inside the chamber by automatically performing ordinary temperature reset processing under conditions such as at every predetermined time or every predetermined number of lots.

Note that in the present invention, the "ordinary temperature" in the ordinary temperature reset processing includes a temperature higher than the ordinary temperature at the time of an ordinary temperature test and is used in the sense of including for example a temperature of 60° C. or more. That is, the "ordinary temperature" in ordinary temperature reset processing means a temperature of an extent enabling prevention of condensation inside the chamber.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and features of the present invention will become more apparent from the following description of the preferred embodiments given with reference to the attached drawings which are given by way of illustration only, and thus are not limitative of the present invention, and in which.

DESCRIPTION OF THE PREFERRED EMBODIMENTS

Figure 1:
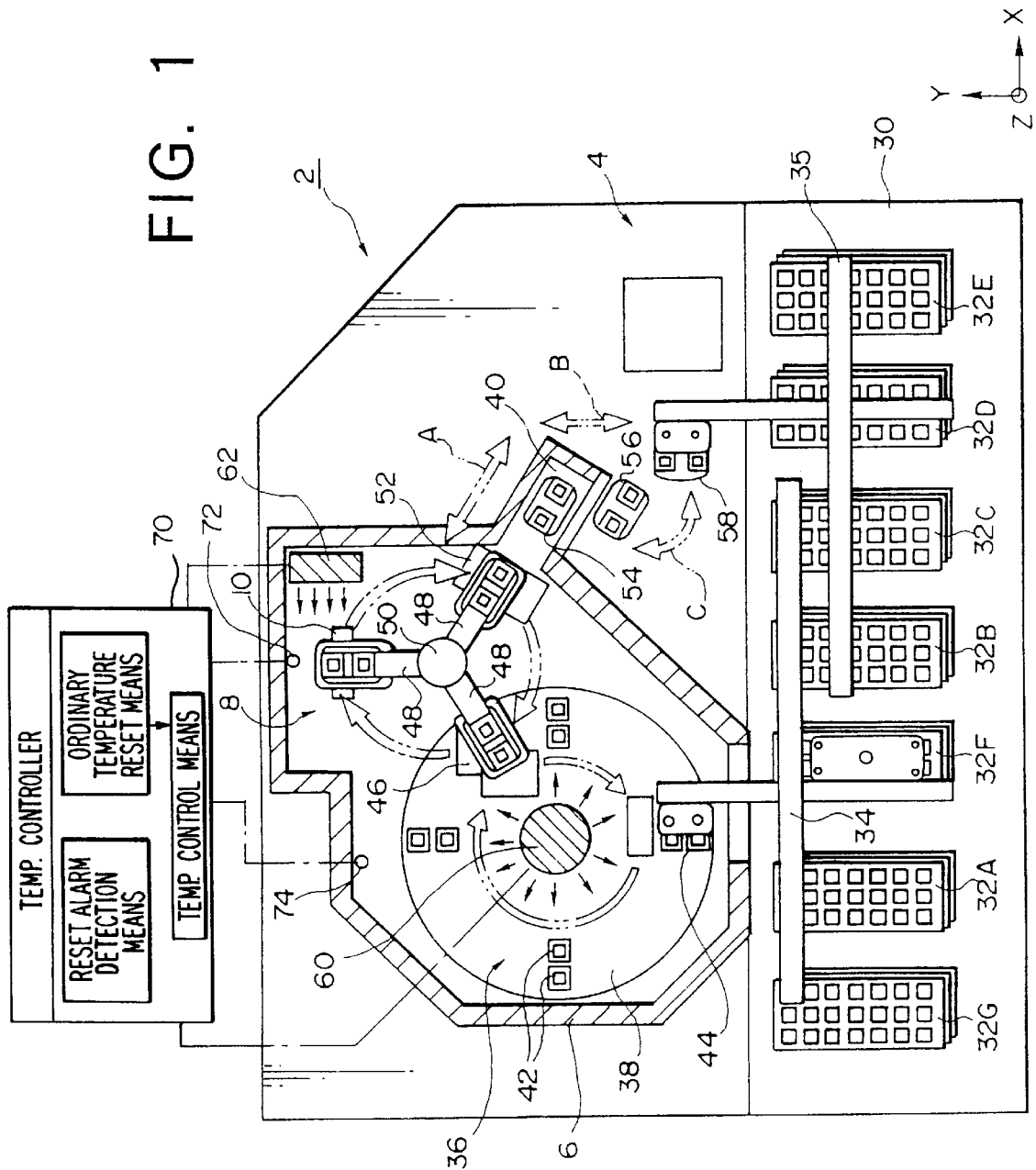
FIG. 1 is a schematic view of the configuration of an IC chip testing apparatus according to a first embodiment of the present invention.

As shown in FIG. 1, the IC chip testing apparatus 2 according to the present embodiment is an apparatus for testing an IC chip, as a device under test, in an ordinary temperature, low temperature, or high temperature state and is provided with a handler 4 and a main test unit, not shown. The handler 4 conveys IC chips to be tested successively to IC sockets provided at the test head and stores the IC chips finished being tested on predetermined trays sorted in accordance with the test results.

Figure 2:
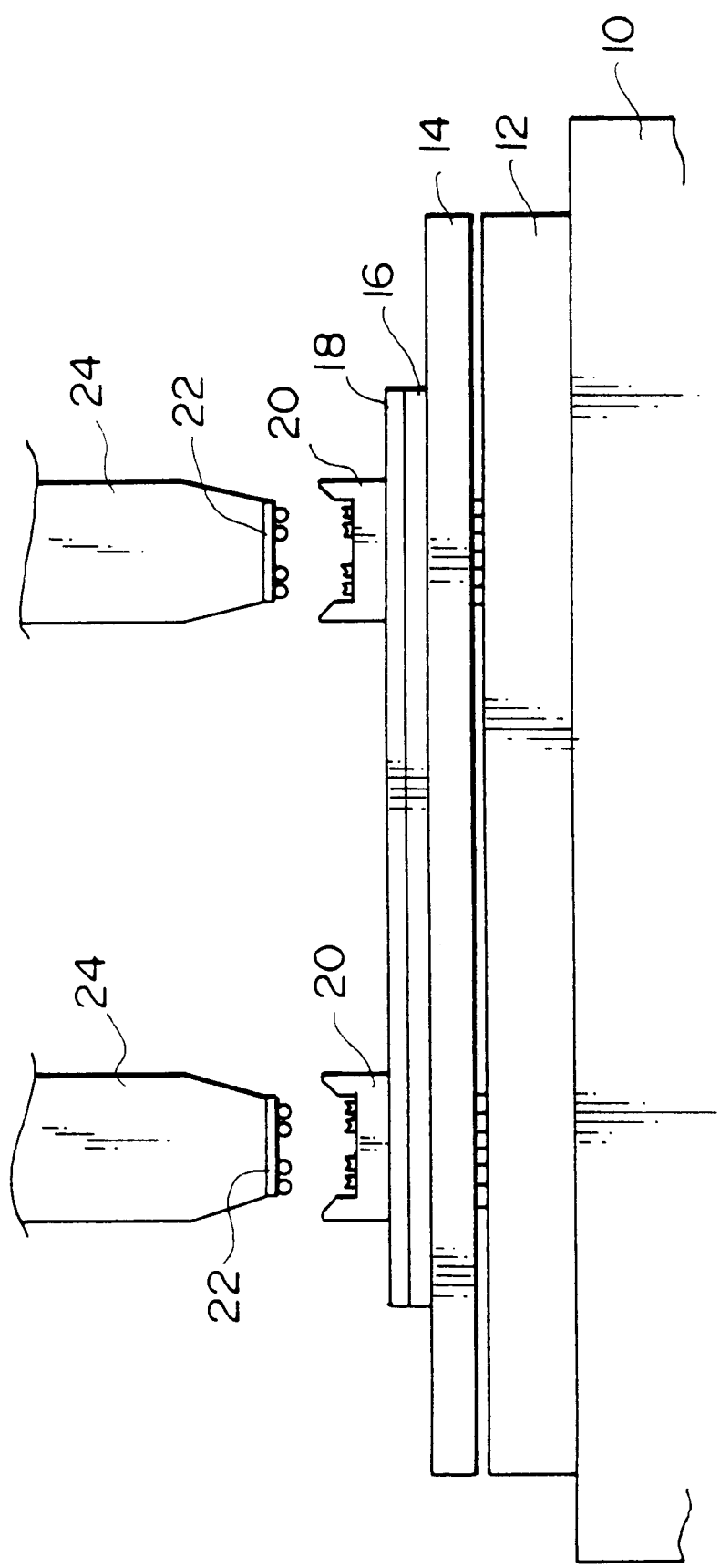
FIG. 2 is a schematic sectional view of key portions showing the vicinity of a test head of an IC chip testing apparatus.

In this embodiment, the handler 4 is provided with a chamber 6. The top of a test head 10 is exposed at a test stage 8 in the chamber 6. The top of the test head 10 is shown in FIG. 2. The top of the test head 10 has a mother board 12 attached to it. The mother board 12 has mounted on it a detachable exchangeable adapter 14. The exchangeable adapter 14 has mounted on it a board spacer 16 and socket board 18. Sockets 20 are mounted on top of this. The sockets 20 have the IC chips 22 to be tested conveyed from pickup heads 24 successively detachably mounted in them.

The IC sockets 20 provided on the test head 10 are connected through cables to the main test device (not shown). The IC chips 22 detachably mounted at the IC sockets 20 are connected through the cables to the main test device, then the IC chips 22 are tested by test signals from the main test device.

When the type of the IC chips 22 under test change, the exchangeable adapter 14 is detached from the motherboard 12 and another adapter 14 is attached so as to enable different IC chips 22 to be examined. Note that when the content of the test changes drastically, this can be handled by detaching the test head 10 from the handler 4 and arranging another test head 10 below the handler 4.

As shown in FIG. 1, the handler 4 has an IC magazine 30 for storing IC chips to be tested and storing tested IC chips sorted into classes. The IC magazine 30 holds loader use trays 32A on which IC chips to be tested are carried, sorting trays 32B to 32E on which tested IC chips are carried sorted into classes, empty trays 32F, and option trays 32G. These trays 32A to 32G are arranged at predetermined intervals along the X-direction and are stacked in the Z-direction (height direction).

IC chips carried on a loader tray 32A are conveyed to a soak stage 36 inside the chamber 6 using a first XY-conveyor 34 attached to the handler 4. Further, the IC chips finished being tested at the test head 10 are finally loaded sorted on the sorting trays 32B to 32E of the IC magazine 30 using a second XY-conveyor 35. Among the sorting trays 32B to 32E, for example, the trays 32C are the tray for good devices, while the other trays are the trays for the defective devices or devices for retesting.

The empty trays 32F are conveyed to and stacked over the sorting trays 32B to 32E which have become filled with the tested IC chips and are used as sorting trays. The option trays 32G are used for other applications.

The inside of the chamber 6 is air-tight in structure except for the portion for transfer of the IC chips which is designed to be able to open and close by a shutter etc. and for example can maintain room temperature to a high temperature state of about 160° C. or room temperature to a low temperature state of about −60° C. The inside of the chamber 6 is divided into a soak stage 36, a test stage 8, and an exit stage 40.

The soak stage 36 has a turntable 38 arranged in it. The surface of the turntable 38 has 5 indentations 42 for temporarily holding IC chips arranged at a predetermined pitch along the circumferential direction. In the present embodiment, there are two indentations 42 formed in the radial direction of the turntable 38. The two indentations 42 are arranged at a predetermined pitch in the circumferential direction. The turntable 38 turns clockwise. The IC chips dropped into the indentations 42 of the turntable 38 at the loading position 44 by the first XY-conveyor 34 are given a thermal stress until the temperature conditions to be tested are reached while the turntable 38 is being indexed in the direction of rotation.

At a takeout position 46 about 230 degrees in the direction of rotation from the loading position 44 based on the center of rotation of the turntable 38, the pickup heads attached to one of the three contact arms 48 are positioned above the turntable 38. At that position, IC chips can be taken out from the indentations 42 by the pickup heads. The three contact arms 48 are attached at angles of substantially equal amounts in the circumferential direction with respect to the shaft 50 and can be indexed 120 degrees at a time in the clockwise direction of rotation about the shaft 50. Note that this "index" means to repeatedly turn by a predetermined angle, then stop, then again turn by a predetermined angle. At the time of this indexing of a contact arm 48, the time when the arm 48 is stopped corresponds to the time during which IC chips are mounted in sockets of the test head 10 and tested plus the time for attachment and detachment of the IC chips to or from the sockets. The stopping time of this indexing is the same as the stopping time of the indexing at the turntable 38. The turntable 38 and the contact arm 48 are rotated to be indexed synchronously.

In the embodiment, the pickup heads of one of the three contact arms 48 are positioned above the takeout position 46 of the soak stage 36, the pickup heads of another of the contact arms 48 are positioned above the contact heads 10 of the test stage 8, and the pickup heads of the other of the contact arms 48 are positioned above the inlet 52 of the exit stage 40.

The IC chips loaded in the indentations 42 of the turntable 38 at the loading position 44 of the turntable 38 are given a predetermined thermal stress while being indexed from the loading position 44 to the takeout position 46 and are picked up by the pickup heads of a contact arm 48 at the takeout position 46. The IC chips picked up by the pickup heads are positioned above the test head 10 by the indexing of the contact arm 48 in the clockwise direction. At that position, as shown in FIG. 2, the IC chips 22 picked up and held by the pickup heads 24 are attached to the sockets 20 and tested.

The IC chips 22 attached to the sockets 20 above the test head 10 and finished being tested are picked up again by the pickup heads 24 and positioned above the inlet 52 of the exit stage 40 by the indexing of the contact arm 48 shown in FIG. 1 in the clockwise direction. At this position, the tested IC chips are slid to the exit position 54 by an exit shifter in the direction of the arrow A. At the exit position of the exit stage 40, the IC chips arranged above the exit shifter are returned from the temperature of the test, that is, the low temperature or the high temperature, to ordinary temperature. In the case of a low temperature test, the IC chips are returned to ordinary temperature at the exit stage 40 so it is possible to effectively prevent condensation from occurring on the IC chips directly after being taken out from the chamber 6.

The IC chips arranged above the exit shifter at the exit position 54 of the exit stage 40 are returned to ordinary temperature, then shifted in the direction of the arrow B by a not shown exit arm and moved to an exit turn arranged at the receiving position 56. The exit turn is designed to be able to move back and forth between the receiving position 56 and the eject position 58 by turning in the direction of the arrow C. The pickup heads of the second XY-conveyor 35 are designed to be able to move to the eject position 58 of the exit turn. The tested IC chips arranged at the eject position by the exit turn are conveyed by the conveyor 35 to one of the sorting trays 32B to 32E based on the test results.

In the device testing apparatus 2 according to the present embodiment, a soak stage heat exchanger 60 is arranged at the ceiling of the soak stage 36 inside the chamber 6 of the handler 4 and a test stage heat exchanger 62 is arranged at the side wall of the test stage 8. These heat exchangers 60 and 62 are provided with cooling units using liquid nitrogen etc. as a coolant and blowers for circulating the cold air inside the chamber when the testing apparatus 2 is able to perform low temperature tests. When the testing apparatus is able to perform high temperature tests, the heat exchangers 60 and 62 are provided with heating units and blowers. When the testing apparatus is able to perform low temperature tests and high temperature tests, the heat exchangers 60 and 62 are provided with cooling units, heating units, and blowers and are used switching between the cooling units and heating units. These heat exchangers 60 and 62 are controlled by a temperature controller 70. The temperature controller 70 receives as input output signals from a temperature sensor 72 arranged at the test stage 8, temperature sensor 74 arranged at the soak stage 36, and other sensors and can control the amount of heat exchange (output) of the heat exchangers 60 and 62 in accordance with the output signals from these sensors.

In the following explanation, the explanation will be given of the case where the testing apparatus 2 is one able to perform both high temperature tests and low temperature tests and the testing apparatus is used mostly for performing low temperature tests.

When the testing apparatus 2 shown in FIG. 1 is used and the inside of the chamber 6 is made low temperature to conduct low temperature tests on the IC chips in the test stage 8, sometimes the inside of the chamber 6 cannot be maintained at less than the predetermined temperature due to some abnormality or another. In such a case, normally a temperature alarm is issued and the temperature control by the temperature controller 70 is stopped.

In testing apparatuses of the related art, only the temperature control was stopped, so sometimes condensation occurred inside the chamber 6. Further, the condensation inside the chamber sometimes occurred by long term operation of the testing apparatus 2.

Figure 3:
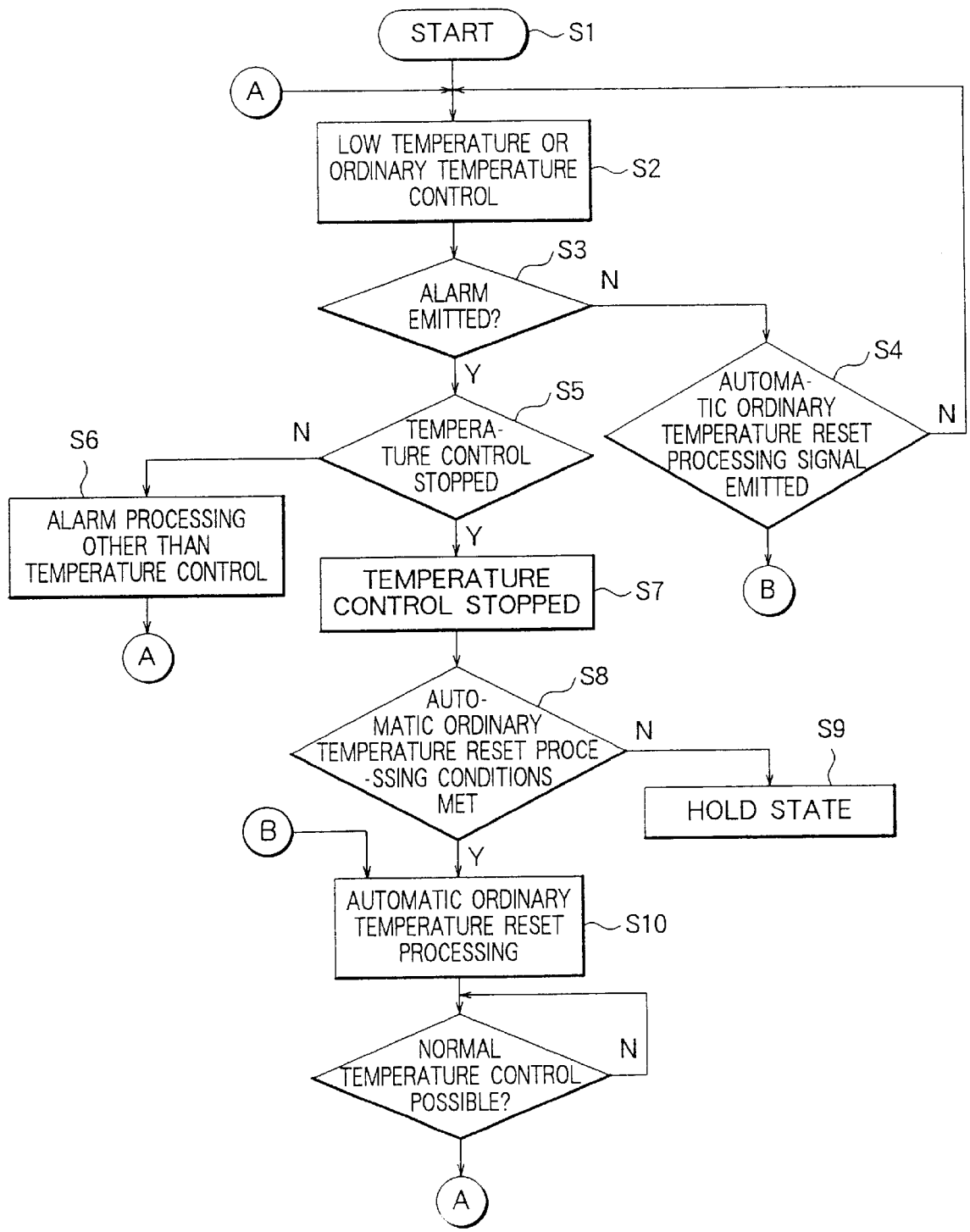
FIG. 3 and FIG. 4 are flow charts of the automatic ordinary temperature reset operation.
Figure 4:
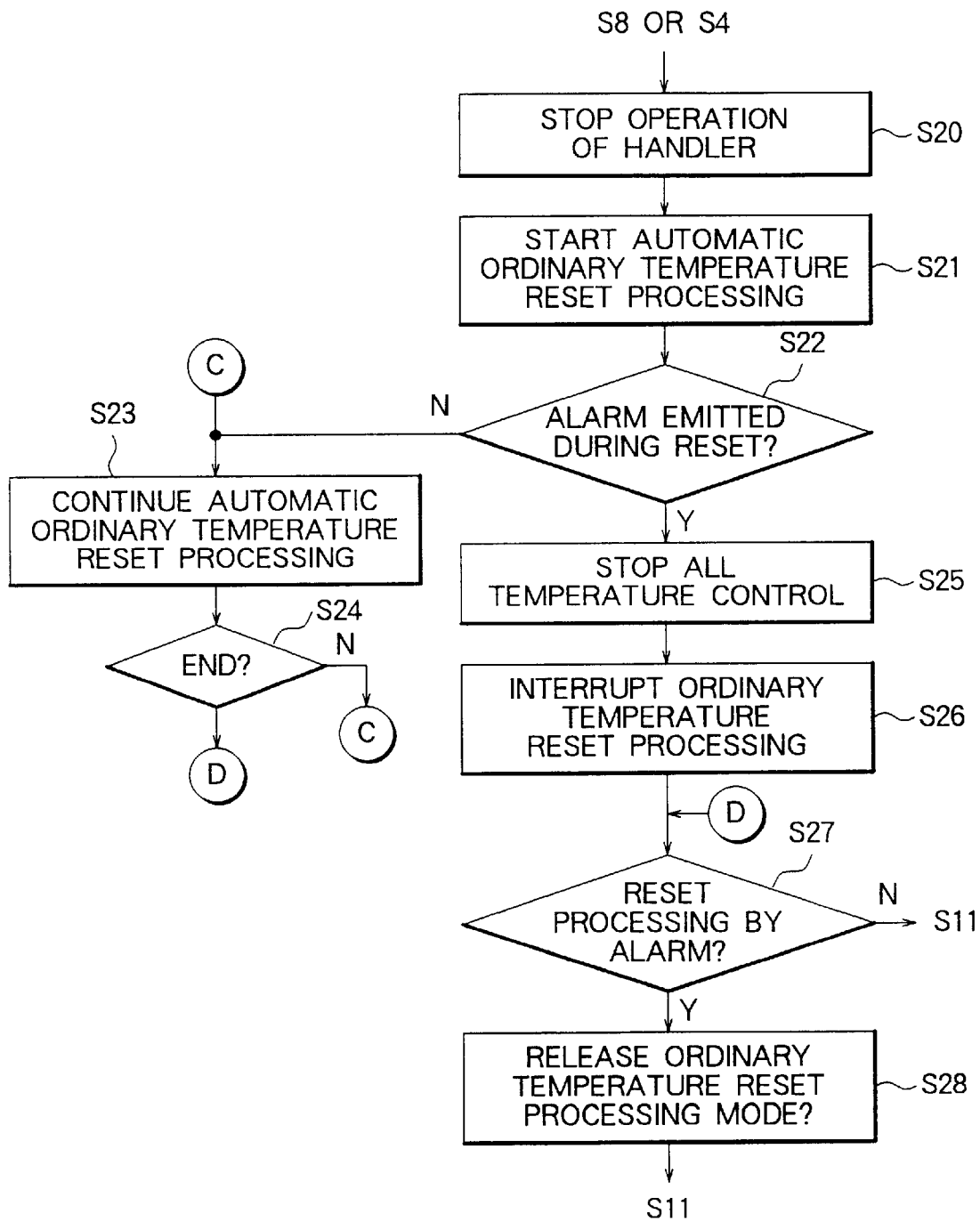

In the testing apparatus 2 according to the present embodiment, the condensation liable to occur inside the chamber is effectively prevented by making the temperature controller 70 shown in FIG. 1 execute the control flow shown in FIG. 3 and FIG. 4.

When the control is started at step Si shown in FIG. 3, at step S2, the temperature controller 70 shown in FIG. 1 sends a control signal to the heat exchangers 60 and 62 and other heat exchangers and performs low temperature control or ordinary temperature control inside the chamber 6. In low temperature control, temperature control is performed inside the chamber 6 at one of the temperature settings in the range from −55.0° C. to 15.9° C. Further, in ordinary temperature control, temperature control is performed inside the chamber 6 at one of the temperature settings in the range from 16.0° C. to 39.9° C. The temperature inside the chamber 6 is controlled so that the temperature converges to a range of temperature of ±α (3° C. to 7° C.) from the temperature setting.

In the state with the inside of the chamber 6 maintained at the above temperature conditions, IC chips are successively transferred from the loader trays 32A shown in FIG. 1 using the first XY-conveyor 34 to indentations 42 at the loading position 44 of the soak stage 36 inside the chamber 6 and the turntable 38 is indexed. While the turntable 38 is being indexed, the IC chips are sufficiently cooled. The IC chips are transferred above the test head 10 of the test stage 8 using a contact arm 48 at the takeout position 46 of the turntable 38. As shown in FIG. 2, they are attached to the sockets 20 by the pickup heads 24 of the contact arm and tested there. The IC chips 22 finished being tested are transferred by the contact arm 48 shown in FIG. 1 to the inlet 52 of the exit stage 40. At this position, the tested IC chips are slid to the exit position 54 by the exit shifter in the direction of the arrow A. At the exit position of the exit stage 40, the IC chips arranged above the exit shifter are returned from the temperature at the time of the test, that is, low temperature, to close to the temperature of the outside air. By returning the IC chips to close to the temperature of the outside air at the exit stage 40, it is possible to effectively prevent condensation occurring at the IC chips immediately after being taken out from the chamber 6.

The IC chips arranged above the exit shifter at the exit position 54 of the exit Stage 40 are returned to close to the temperature of the outside air, then shifted in the direction of the arrow B by the not shown exit arm and transferred to the exit turn arranged at the receiving position 56. The exit turn pivots in the direction of the arrow C and is able to move back and forth between the receiving position 56 and the eject position 58. The pickup heads of the second XY-conveyor 35 are designed to be able to move to the eject position 58 of the exit turn. The tested IC chips arranged at the eject position by the exit turn are conveyed by the conveyor 35 to one of the sorting trays 32B to 32E based on the test results and sorted into trays.

At the time of this test, the temperature controller 70 shown in FIG. 1 detects whether an alarm signal is being emitted at all times as shown by step S3 shown in FIG. 3. As the alarm signal, there are for example a temperature alarm signal for notifying that the temperature inside the chamber 6 is more than a predetermined temperature (for example, a temperature setting+α), a temperature alarm signal for notifying that the temperature in the chamber is less than a predetermined temperature (for example, a temperature setting+α), an alarm signal for showing an abnormality of the temperature sensor for detecting the temperature in the chamber, an abnormality alarm signal for showing that the temperature drop after the start of cooling in the chamber is too slow, an alarm signal for showing an abnormality in the heat exchangers 60 and 62, and an alarm signal for showing abnormalities other than at the chamber, etc.

When such an alarm signal is not detected, the routine proceeds to step S4. When it is detected, the routine proceeds to step S5. At step S5 (reset alarm detecting means), it is judged if the detected alarm signal is a reset alarm signal for stopping the temperature control. When not an alarm signal for stopping the temperature control or other reset alarm signal since it is not an alarm for stopping the temperature control, the routine proceeds to step S6, processing is performed on the alarm other than the temperature control, and the routine returns to seep S2. When it is judged at step S5 that the signal is a reset alarm signal, the temperature controller 70 shown in FIG. 1 stops the temperature control at the time of an ordinary test at step S7 and the routine proceeds to step S8.

At step S8 (condition judging means), the testing apparatus 2 judges if the automatic reset processing conditions have been met or not. The case where the automatic reset processing conditions have been met is for example the case where all of the following conditions have been met. That is, all of the conditions are met when (1) the setting of the automatic ordinary temperature reset processing function are valid, (2) the switch of the temperature controller 70 is "on", (3) the cover of the chamber 6 is completely closed, and (4) it is judged at step S5 that the signal is a reset alarm signal. In the present invention, however, the case where the automatic reset processing conditions are met does not necessarily have to mean all of the conditions of the above (1) to (4) have to be met. It is also possible for one or more of these or other conditions to be met.

When it is judged at step S8 that the automatic ordinary temperature reset processing conditions are not met, the routine proceeds to step S9, where the state at that time is maintained without the automatic ordinary temperature reset processing being performed. In this case, the operator of the testing apparatus prevents condensation from occurring inside the chamber 6 manually.

If the conditions are met at step S8, automatic ordinary temperature reset processing is performed at step S10 (ordinary temperature resetting means), then it is judged at step Sll if the normal temperature control state has been returned to. Only when returned to does the routine return to step S2 and is the above control repeated.

Details of the automatic ordinary temperature reset processing shown in FIG. 3 are shown in FIG. 4. As shown in FIG. 4, in the automatic ordinary temperature reset processing, first, at step S20, the operation of the handler 4 shown in FIG. 1 is stopped and the conveyance of the IC chips is stopped. Next, at step S21, the automatic ordinary temperature reset processing is started. Specifically, the temperature controller 70 shown in FIG. 1 sends a control signal to the heaters provided as the heating units built into the heat exchangers 60 and 62 and all of the heaters arranged inside the chamber 6 to rapidly heat the inside of the chamber 6 and return the inside of the chamber 6 to ordinary temperature. Note that here, the "ordinary temperature" includes a temperature higher than the ordinary temperature at the time of an ordinary temperature test (16.0 to 39.9° C.) and is used in the sense of including for example a temperature of 60° C. or more. That is, the "ordinary temperature" in ordinary temperature reset processing means a temperature of an extent enabling prevention of condensation inside the chamber. The processing time required for the ordinary temperature reset depends on the internal volume of the chamber 6, the initial temperature of the chamber 6, the capacity of the heaters, etc., but is about several minutes to 10 or so minutes.

When the automatic ordinary temperature reset processing is started at step S21, it is detected at step S22 (reset interruption alarm detecting means) if an interruption alarm signal has been emitted or not during the reset processing. As the interruption alarm signal, an alarm signal of the opening of the door of the chamber 6 and a temperature alarm signal for showing that the temperature of the inside of the chamber 6 has risen abnormally may be mentioned. When such an interruption alarm signal is received by the controller 70 shown in FIG. 1, the routine proceeds to the step S25 shown in FIG. 4, all of the temperature control is stopped, and the ordinary temperature reset processing is interrupted at step S26 (reset interrupting means). When an interruption alarm is not detected at step S22, the routine proceeds to step S23 where the automatic ordinary temperature reset processing is continued, then at step S24, it is judged if the ordinary temperature reset processing control has ended or not. Whether or not the ordinary temperature reset processing control has ended is judged by whether the temperature inside the chamber 6 has risen sufficiently to an ordinary temperature of an extent enabling prevention of condensation. Specifically, this is judged by the controller 70 based on the output signals of the temperature sensors 72 and 74. When it is judged at step S24 that the ordinary temperature reset processing has ended, the routine proceeds to step S27, while when not, step S23 is continued.

When the ordinary temperature reset processing is interrupted at step S26 and when the ordinary temperature reset processing has ended at step S24, it is judged at step S27 whether these reset processings are reset processings based on reset alarm signals judged by step S5 shown in FIG. 3. In this case, the routine proceeds to step S28 (reset processing mode releasing means) and the automatic ordinary temperature reset processing mode is released. That is, an automatic ordinary temperature reset processing mode based on a reset alarm signal is entered only once. This is to prevent this situation from continuing several times. Note that if the automatic ordinary temperature reset processing mode based on a reset alarm signal is again set, the mode becomes the automatic ordinary temperature reset processing mode based on a reset alarm signal and the above-mentioned control can be performed.

In the present embodiment, in addition to the automatic ordinary temperature reset processing based on such a reset alarm signal, the automatic ordinary temperature reset operation shown from step S4 shown in FIG. 3 on is also performed.

The case where the routine proceeds to step S4 shown in FIG. 3 is the case where the testing apparatus 2 shown in FIG. 1 is operated for a long period of time without the occurrence of an alarm at step S3. In such a case, it is detected at step S4 (reset processing signal detecting means) whether the controller 70 shown in FIG. 1 has emitted an automatic ordinary temperature reset processing signal. When it has not emitted it, the routine returns to step S2 and the following control is repeated. When it has emitted it, the routine proceeds to step S10, where the automatic ordinary temperature reset processing shown in FIG. 4 is performed. When it is judged at step S27 shown in FIG. 4 that the processing is not reset processing based on a reset alarm signal, however, the routine proceeds to step S11 without proceeding to step S28 and the ordinary temperature reset processing mode is not released. That is, in this case, there is a possibility that the automatic ordinary temperature reset processing will be repeatedly performed.

The case where an automatic ordinary temperature reset processing signal is emitted at step S4 is for example the case of measuring the time of continuous operation of the device testing apparatus 2 and the time of continuous operation measured being at least a predetermined time.

Further, the controller of the handler 4 of the device testing apparatus 2 may measure the number of lots of the devices tested, detect when the number of lots measured reach a point of a predetermined number of lots, and in that case send a reset processing signal to the controller 70 shown in FIG. 1 to detect the automatic ordinary temperature reset processing signal.

Further, this may be judged by the controller 70 shown in FIG. 1 detecting that the reset processing signal emitted from the main test device (not shown) connected to the test head 10 shown in FIG. 1 and FIG. 2. Since the main test device manages the measurement conditions, measurement results, measurement time, etc., it is also possible to output an automatic ordinary temperature reset processing signal (reset processing request) based on that information.

Further, in a system controlling production of and monitoring the device testing apparatus 2 shown in FIG. 1 on a network, this may be judged by the controller 70 shown in FIG. 1 detecting a reset processing signal emitted from a host computer. The host computer, like a main test device, manages the measurement conditions, measurement results, measurement time, etc., so it is possible to output an automatic ordinary temperature reset processing signal (reset processing request) based on this information.

Note that the present invention is not limited to the above embodiments. Various modifications may be made within the scope of the present invention.

For example, in the above embodiments, the explanation was made mainly of the case of performing low temperature tests inside the chamber 6 shown in FIG. 1, but the present invention can also be applied to a case of performing ordinary temperature tests inside the chamber 6. Further, the testing apparatus 2 shown in FIG. 1 is of a type able to perform both ordinary temperature tests and/or high temperature tests as well inside the chamber 6, but the testing apparatus according to the present invention may also be applied to a testing apparatus for performing only low temperature tests or a testing apparatus for performing only ordinary temperature tests. Further, in the testing apparatus according to the present invention, the method of handling IC chips in the handler 4 is not limited to the illustrated embodiments.

What is claimed is:

1. A device testing apparatus comprising:
   a chamber having an interior test stage for testing a device;
   a cooling unit able to cool the inside of the chamber to a temperature less than ordinary temperature;
   a heating unit able to heat the inside of the chamber to return the chamber to ordinary temperature;
   a temperature sensor for detecting the temperature inside the chamber; and
   a temperature controller for controlling the output of at least one of the cooling unit and heating unit in accordance with an output from the temperature sensor, wherein
   the temperature controller comprises:
   reset alarm detecting means for detecting if a reset signal relating to an abnormality inside the chamber for stopping the device testing apparatus has been emitted and
   ordinary temperature resetting means for stopping the cooling by the cooling unit and starting up the heating unit to heat the inside of the chamber to return the chamber to ordinary temperature for preventing condensation inside the chamber based on the reset alarm signal detected by the reset alarm detecting means.

2. The device testing apparatus as set forth in claim 1, wherein the ordinary temperature resetting means comprises:
   reset interruption alarm detecting means for judging if a reset interruption alarm signal has been emitted during the ordinary temperature resetting processing; and
   reset interrupting means for interrupting the ordinary temperature resetting processing by the ordinary temperature resetting means when the reset interruption alarm signal has been detected by the reset interruption alarm detecting means.

3. The device testing apparatus as set forth in claim 1, wherein normal temperature control is resumed after the ordinary temperature reset processing by the ordinary temperature resetting means based on the reset alarm signal has ended, it is judged whether the ordinary temperature reset processing by the ordinary temperature resetting means has suitably ended, and it has suitably ended.

4. The device testing apparatus as set forth in claim 1, further comprises reset processing mode releasing means for releasing the ordinary temperature reset processing mode under predetermined conditions after the ordinary temperature reset processing by the ordinary temperature resetting means based on the reset alarm signal has ended or after the ordinary temperature reset processing has been interrupted by the reset interrupting means.

5. The device testing apparatus as set forth in claim 1, wherein the temperature controller further comprises condition judging means for judging if the ordinary temperature reset processing conditions have been met and allowing the start of the ordinary temperature reset processing by the ordinary temperature resetting means only when the conditions are met.

6. The device testing apparatus as set forth in claim 1, wherein the reset alarm signal is a temperature alarm signal for notifying that the temperature inside the chamber is above a predetermined temperature.

7. The device testing apparatus as set forth in claim 2, wherein the reset interruption alarm signal is a cover alarm signal for notifying that a cover the chamber is open.

8. A device testing apparatus comprising:
   a chamber having an interior test stage for testing a device;
   a cooling unit able to cool the inside of the chamber to a temperature less than ordinary temperature;
   a heating unit able to heat the inside of the chamber to return the chamber to ordinary temperature;
   a temperature sensor for detecting the temperature inside the chamber; and
   a temperature controller for controlling the output of at least one of the cooling unit and heating unit in accordance with an output from the temperature sensor, wherein
   the temperature controller comprises:
   reset processing signal detecting means for detecting if an ordinary temperature reset processing signal has been emitted and ordinary temperature resetting means for stopping the cooling by the cooling unit and starting up the heating unit to heat the inside of the chamber to return the chamber to ordinary temperature for preventing condensation inside the chamber based on the reset processing signal detected by the reset processing signal detecting means.

9. The device testing apparatus as set forth in claim 8, wherein the reset processing detecting means measures the time of continuous operation of the device testing apparatus, detects when the time of continuous operation measured is a predetermined time or more, and detects the reset processing signal emitted at that time.

10. The device testing apparatus as set forth in claim 8, wherein the reset processing detecting means measures the number of lots of the devices tests by the device testing apparatus, detects when the number of lots measured reaches a point of a predetermined number of lots, and detects the reset processing signal emitted at that time.

11. The device testing apparatus as set forth in claim 8, wherein the reset processing detecting means detects a reset processing signal emitted from a main test unit.

12. The device testing apparatus as set forth in claim 8, wherein the reset processing detecting means detects a reset processing signal emitted from a host computer.

13. A test method comprising the steps of:

maintaining an inside of a chamber at a predetermined low temperature and in that state testing a device transferred to the inside of the chamber;

detecting if a reset alarm signal relating to an abnormality inside the chamber for stopping the device testing apparatus has been emitted; and stopping the cooling of the inside of the chamber by a cooling unit and starting up a heating unit to heat the inside of the chamber to return the chamber to ordinary temperature for preventing condensation inside the chamber based on the reset alarm signal detected during the step of detecting the reset alarm.

14. A test method comprising the steps of:

maintaining an inside of a chamber at a predetermined low temperature and in that state testing a device transferred to the inside of the chamber;

detecting if an ordinary temperature reset processing signal has been emitted; and stopping the cooling of the inside of the chamber by a cooling unit and starting up a heating unit to heat the inside of the chamber to return the chamber to ordinary temperature for preventing condensation inside the chamber based on the reset processing signal.

* * * * *